(12) United States Patent
Hsiao et al.

(10) Patent No.: US 11,244,919 B2
(45) Date of Patent: Feb. 8, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Ching-Wen Hsiao, Hsinchu (TW); Chen-Shien Chen, Hsinchu County (TW); Kuo-Ching Hsu, Taipei (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/367,273

(22) Filed: Mar. 28, 2019

(65) Prior Publication Data
US 2019/0371754 A1    Dec. 5, 2019

Related U.S. Application Data

(63) Continuation of application No. 15/452,674, filed on Mar. 7, 2017, now Pat. No. 10,276,525.

(60) Provisional application No. 62/427,138, filed on Nov. 28, 2016.

(51) Int. Cl.
*H01L 23/00* (2006.01)
*H01L 23/31* (2006.01)
*H01L 21/56* (2006.01)

(52) U.S. Cl.
CPC .............. *H01L 24/14* (2013.01); *H01L 24/13* (2013.01); *H01L 24/17* (2013.01); *H01L 21/561* (2013.01); *H01L 23/3114* (2013.01); *H01L 2224/02311* (2013.01); *H01L 2224/02331* (2013.01); *H01L 2224/02381* (2013.01);
(Continued)

(58) Field of Classification Search
CPC .................... H01L 24/13; H01L 24/14; H01L 2224/02311; H01L 2224/02381; H01L 2224/02331; H01L 24/17; H01L 2224/13024; H01L 2224/16265
See application file for complete search history.

(56) References Cited

U.S. PATENT DOCUMENTS

6,181,569 B1 * 1/2001 Chakravorty ........... H01L 24/13
361/761
8,987,922 B2    3/2015 Yu et al.
(Continued)

*Primary Examiner* — Syed I Gheyas
(74) *Attorney, Agent, or Firm* — JCIPRNET (57) ABSTRACT

A package structure is provided comprising a die, a redistribution layer, at least one integrated passive device (IPD), a plurality of solder balls and a molding compound. The die comprises a substrate and a plurality of conductive pads. The redistribution layer is disposed on the die, wherein the redistribution layer comprises first connection structures and second connection structures. The IPD is disposed on the redistribution layer, wherein the IPD is connected to the first connection structures of the redistribution layer. The plurality of solder balls is disposed on the redistribution layer, wherein the solder balls are disposed and connected to the second connection structures of the redistribution layer. The molding compound is disposed on the redistribution layer, and partially encapsulating the IPD and the plurality of solder balls, wherein top portions of the solder balls and a top surface of the IPD are exposed from the molding compound.

17 Claims, 5 Drawing Sheets

(52) U.S. Cl.
CPC ............... *H01L 2224/1191* (2013.01); *H01L 2224/13014* (2013.01); *H01L 2224/13022* (2013.01); *H01L 2224/13024* (2013.01); *H01L 2224/14134* (2013.01); *H01L 2224/14135* (2013.01); *H01L 2224/16265* (2013.01); *H01L 2224/171* (2013.01); *H01L 2224/1703* (2013.01); *H01L 2224/73204* (2013.01); *H01L 2924/19103* (2013.01)

(56) References Cited

U.S. PATENT DOCUMENTS

| | | |
|---|---|---|
| 9,196,532 B2 | 11/2015 | Tu et al. |
| 9,196,559 B2 | 11/2015 | Tsai et al. |
| 9,257,333 B2 | 2/2016 | Lu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,372,206 B2 | 6/2016 | Wu et al. |
| 9,496,189 B2 | 11/2016 | Yu et al. |
| 10,276,525 B2 * | 4/2019 | Hsiao .................. H01L 24/13 |
| 2005/0133933 A1 * | 6/2005 | Shen .................. H01L 24/13 |
| | | 257/779 |
| 2013/0187269 A1 * | 7/2013 | Lin .................. H01L 21/566 |
| | | 257/737 |
| 2014/0057394 A1 * | 2/2014 | Ramasamy .......... H01L 21/561 |
| | | 438/113 |
| 2014/0168014 A1 * | 6/2014 | Chih .................. H01L 21/56 |
| | | 343/700 MS |
| 2016/0118333 A1 * | 4/2016 | Lin .................. H01L 24/97 |
| | | 257/773 |

* cited by examiner

PACKAGE STRUCTURE AND METHOD OF FABRICATING THE SAME

CROSS-REFERENCE TO RELATED APPLICATION

This application is a continuation application of U.S. application Ser. No. 15/452,674, filed on Mar. 7, 2017, now allowed. The prior application Ser. No. 15/452,674 claims the priority benefits of U.S. provisional application Ser. No. 62/427,138, filed on Nov. 28, 2016. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
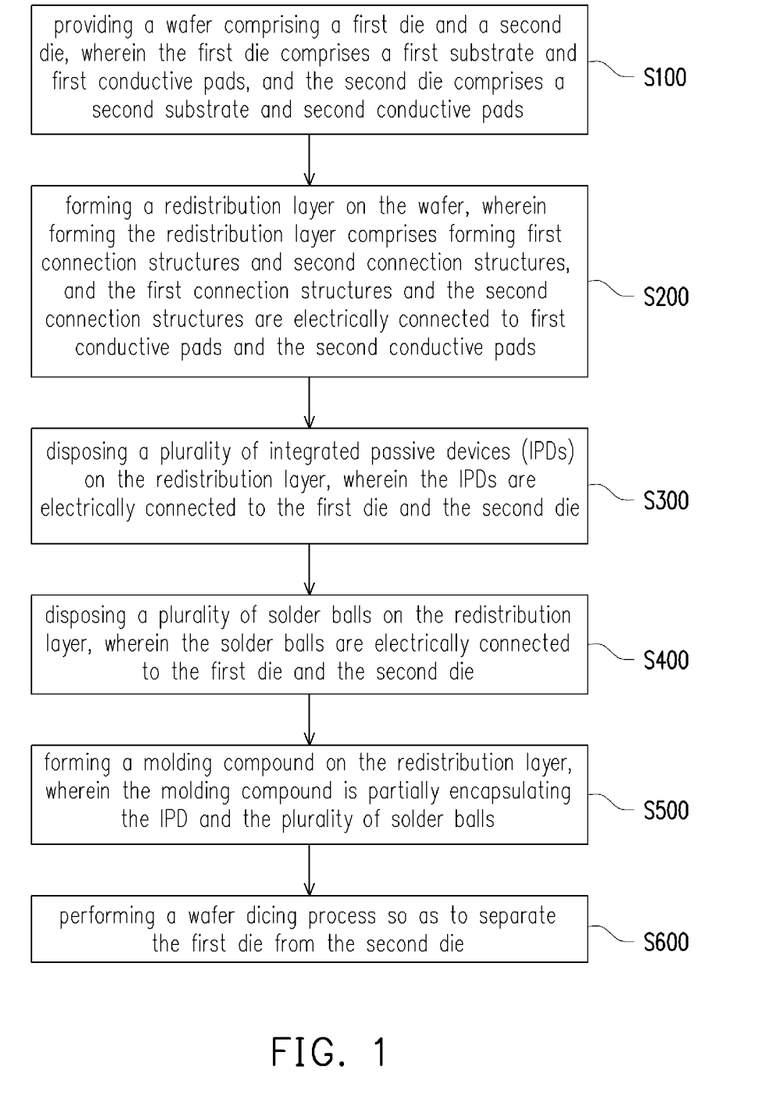
FIG. 1 is an exemplary flow chart showing the process steps of the method of fabricating a package structure in accordance with some embodiments of the present disclosure.

FIG. 1 is an exemplary flow chart showing the process steps of the method of fabricating a package structure in accordance with some embodiments of the present disclosure. The various process steps of the process flow illustrated in FIG. 1 may comprise multiple process steps as discussed below. FIGS. 2A-2F are the schematic cross-sectional views showing the package structure at various stages of the method of fabricating a package structure according to some embodiments of the present disclosure. It is to be noted that the process steps described herein cover a portion of the manufacturing processes used to fabricate a package structure. The embodiments are intended to provide further explanations but are not used to limit the scope of the present disclosure.

Figure 2A:
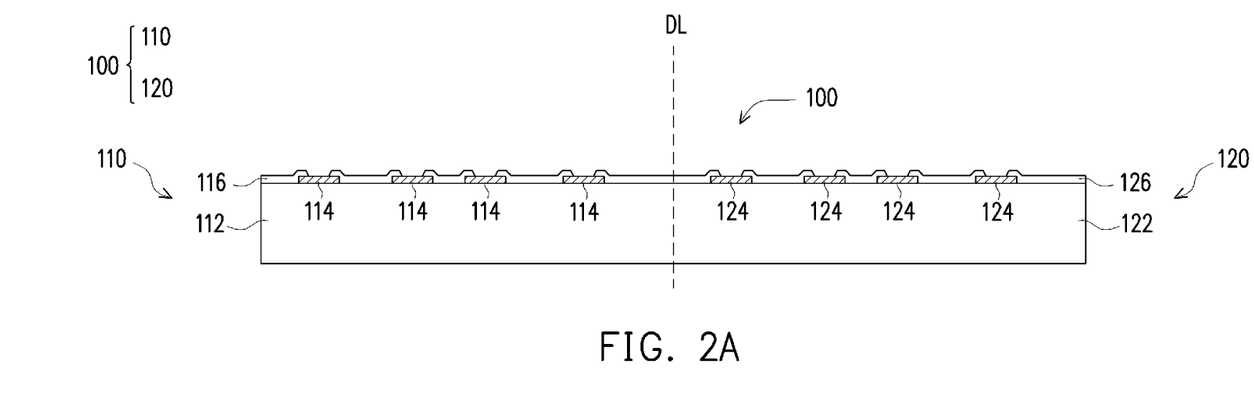
FIGS. 2A-2F are the schematic cross-sectional views showing the package structure at various stages of the method of fabricating a package structure according to some embodiments of the present disclosure.

In accordance with some embodiments, referring to step S100 in FIG. 1 and as shown in FIG. 2A, a wafer 100 comprising a first die 110 and a second die 120 is provided. In FIG. 2A, only two dies are presented for illustrative purposes, however, it should be noted that the wafer 100 may be provided with more than two dies. The die(s) described herein may be referred as a chip or an integrated circuit (IC). In some embodiments, the first die 110 comprises a first substrate 112, a plurality of first conductive pads 114 formed on the first substrate 112, and a passivation layer 116. In one embodiment, the passivation layer 116 is formed over the first substrate 112 and has a plurality of opening so as to partially expose the first conductive pads 114. In some embodiments, the second die 120 comprises a second substrate 122, a plurality of second conductive pads 124 formed on the second substrate 122, and a passivation layer 126. In one embodiment, the passivation layer 126 is formed over the second substrate 122 and has a plurality of opening so as to partially expose the second conductive pads 124. In some embodiments, the material of the passivation layer 116 is the same as that of the passivation layer 126. In some embodiments, the passivation layers 116 and 126 are formed from the same layer in the same process. In some embodiments, the first die 110 and the second die 120 are provided from the same wafer, and the first and second dies 110 and 120 are joined together but defined by the dicing line DL located there between. In some embodiments, the first die 110 and the second die 120 that are to be separated through a wafer dicing process at the dicing line DL are chips of the same type. Alternatively, the first die 110 and the second die 120 may be chips of different types.

In some embodiments, the first substrate 112 and the second substrate 122 are silicon substrates including active components (e.g., transistors, diodes, memories, optoelectronic devices or the like) and optionally passive components (e.g., resistors, capacitors, inductors, transducers, antennas or the like) formed therein. In some embodiments, the first/second substrate 112/122 includes at least one active component, and the active component may be a radio frequency application device for example, transmitters, receivers, modulators or transceivers. In certain embodiments, the first conductive pads 114 and the second conductive pads 124 are aluminum pads, copper pads or other suitable metallic pads. In some embodiments, the passivation layer 116/126 includes a silicon oxide layer, a silicon nitride layer, a silicon oxy-nitride layer or a dielectric layer formed by other suitable dielectric materials.

Figure 2B:
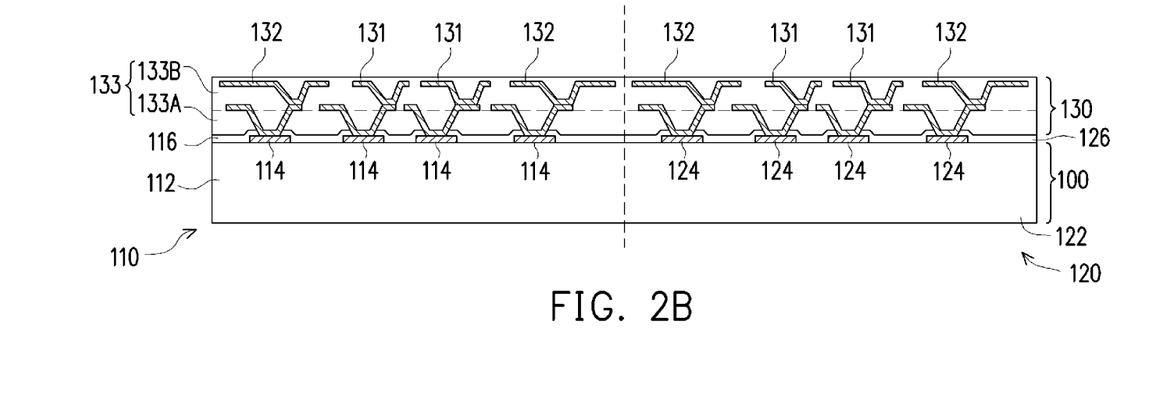

FIG. 2B illustrates a cross-sectional view of the package structure at one of various stages of the fabricating method. Referring to step S200 in FIG. 1 and as shown in FIG. 2B, a redistribution layer 130 is formed on the wafer 100. In some embodiments, the formation of the redistribution layer may comprise forming first connection structures 131 and second connection structures 132 within a dielectric layer 133. In some embodiments, forming the redistribution layer 130 includes forming a first dielectric layer 133A, then pattering the first dielectric layer 133 to form openings, and forming a first metal layer (used to form parts of connection structures 131/132) within the openings and then patterning the first metal layer. Thereafter, a second dielectric layer 133B is formed above the first metal layer and then patterned to form openings that expose the patterned first metal layer, and then a second metal layer (used to form parts of connection structures 131/132) is formed within the openings and then patterned. In the above embodiment, the patterned first and second metal layer form the first connection structures 131 and second connection structures 132 inlaid within the dielectric layer 133 (including the first dielectric layer 133A and the second dielectric layer 133B). However, it should be noted that the redistribution layer 130 is not limited to include two dielectric layers and/or two metal layers. In certain embodiments, the redistribution layer 130 may be made by forming one or more dielectric layers and forming one or more metal layers.

In some embodiments, the first connection structures 131 and the second connection structures 132 are physically and electrically connected to the plurality of first conductive pads 114 and the plurality of second conductive pads 124. In other words, the plurality of first conductive pads 114 and the plurality of second conductive pads 124 are in direct contact with the first connection structures 131 and the second connection structures 132. In some embodiments, the first connection structures 131 and the second connection structures 132 may be physically and electrically separate from each other, and the dielectric layer 133 sandwiched between the first connection structures 131 and the second connection structures 132 separates the first connection structures 131 and the second connection structures 132. In certain embodiments, the redistribution layer does not extend beyond the first and second dies of the wafer 100. That is, in some embodiments, the wafer 100 is a fan-in wafer and the packaging process is a part of a fan-in wafer level packaging processes.

In some embodiments, the materials of the dielectric layer 133 include one or more polymer dielectric materials such as polymide, benzocyclobutene (BCB), polybenzooxazole (PBO), or any other suitable polymer-based dielectric materials. In certain embodiments, the first connection structures 131 and the second connection structures 132 are metallization patterns, and the material of the first connection structures 131 and the second connection structures 132 includes aluminum, titanium, copper, nickel, tungsten, combinations or alloys thereof.

Figure 2C:
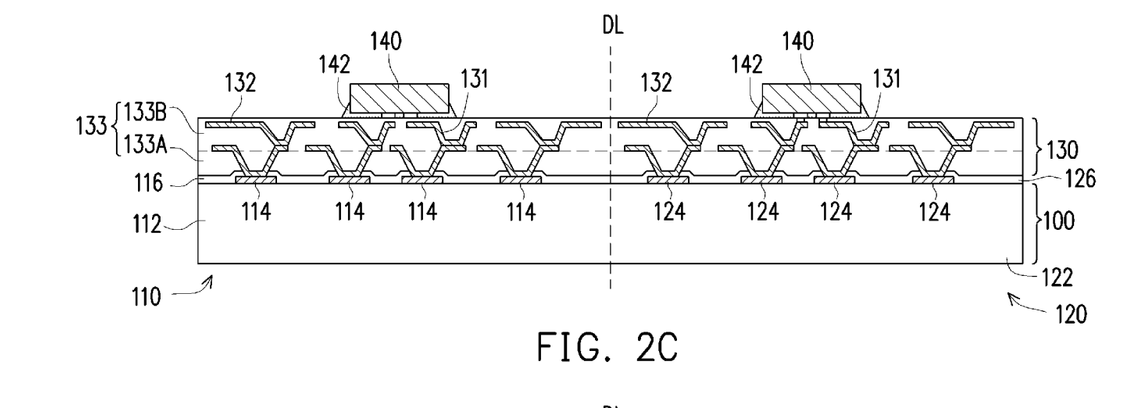

FIG. 2C illustrates a cross-sectional view of the package structure at one of various stages of the fabricating method. Referring to step S300 in FIG. 1 and as shown in FIG. 2C, a plurality of integrated passive device (IPD) 140 is disposed on the redistribution layer 130. In certain embodiments, at least one IPD 140 is disposed on the first die 110 and electrically connected to the first die 110 through the first connection structures 131 of the redistribution layer 130, or disposed on the second die 120 and electrically connected to the second die 120 through the first connection structures 131 of the redistribution layer 130. Only two IPDs 140 are presented in FIG. 2C for illustrative purposes, but the number of IPD 140 mounted on the redistribution layer 130 is not particularly limited to the embodiments and can be varied based on design requirements. In some embodiments, the IPDs 140 are, for example, capacitors, resistors, inductors, diodes and/or the like. In certain embodiments, after forming the IPD 140 on the redistribution layer 130, an underfill structure 142 is optionally formed and filled in between each of the IPD 140 and the redistribution layer 130. In some embodiments, the underfill structure 142 is located above the redistribution layer 130 and fills into the space in between the IPD 140 and the redistribution layer 130. In certain embodiments, the underfill structure 142 is made of a resin material, and a heating step is performed to cure the resin material to form the underfill structure 142. However, in other embodiments, the underfill structure 142 is omitted, and the IPD 140 may be attached onto the redistribution layer 130 without the underfill structure 142.

Figure 2D:
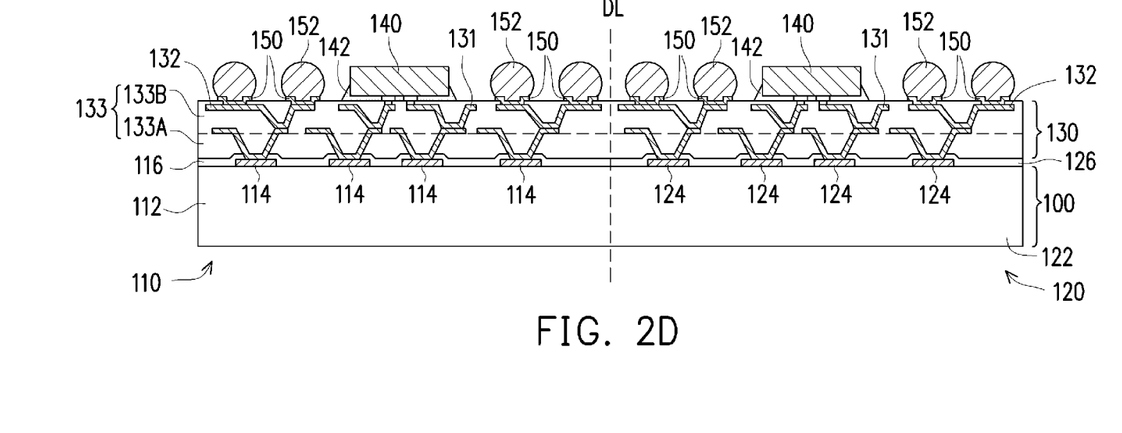

FIG. 2D illustrates a cross-sectional view of the package structure at one of various stages of the fabricating method. Referring to step S400 in FIG. 1 and as shown in FIG. 2D, a plurality of solder balls 152 is formed on the second connection structures 132 of the redistribution layer 130. In one embodiment, the solder balls 152 are disposed on the ball pads 150, so that the solder balls 152 are electrically connected to the first conductive pads 114 of the first die 110 or electrically connected to the second conductive pads 124 of the second die 120 through these ball pads 150 and the redistribution layer 130. In certain embodiments, the ball pads 150 may be formed by forming a metal material over the dielectric layer 133 and the exposed portions of the second connection structures 132 and then patterning the metal material. In some embodiments, the solder balls 152 are attached to the ball pads 150 through a solder flux. In some embodiments, the solder balls 152 are electrically connected to the first die 110 and the second die 120 through the ball pads 150 and the second connection structures 132 of the redistribution layer 130. In some embodiments, the solder balls 152 are disposed adjacent to the IPD 140. In certain embodiments, the solder balls 152 are arranged surrounding the IPD 140. In some embodiments, the materials of the ball pads 150 include copper, nickel, aluminum, tungsten or alloys thereof. In certain embodiments, the ball pads 150 include under-ball metallurgy (UBM) patterns for assisting ball mounting. The number of the ball pads 150 or under-ball metallurgy patterns is not limited by embodiments of this disclosure. Furthermore, in certain embodiments, the solder balls 150 are disposed on the redistribution layer 130 after the IPD 140 is disposed on the redistribution layer 130. However, in other embodiments, the solder balls 150 may be disposed on the redistribution layer 130 prior to disposing the IPD 140 on the redistribution layer. In other words, the order of disposing the IPD 140 and the solder balls 150 is not particularly limited.

Figure 2E:
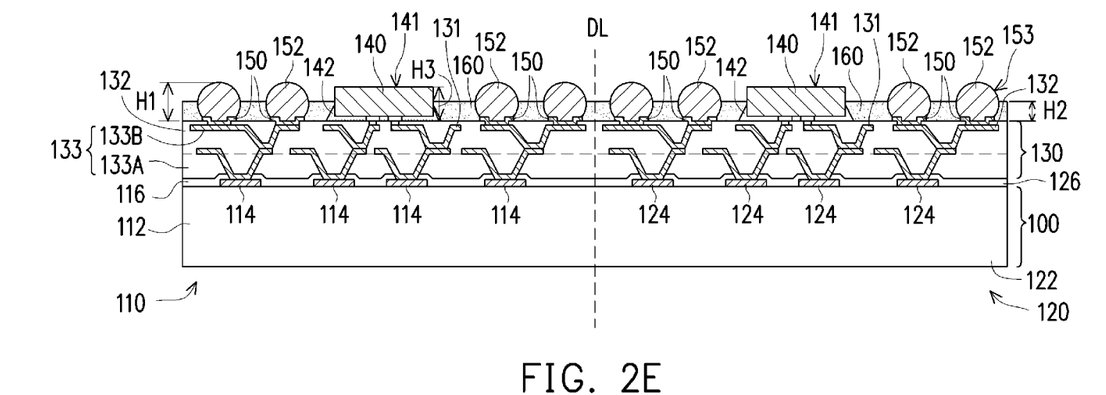

FIG. 2E illustrates a cross-sectional view of the package structure at one of various stages of the fabricating method. Referring to step S500 in FIG. 1 and as shown in FIG. 2E, a molding compound 160 is formed on the redistribution layer 130. In some embodiments, the molding compound 160 includes, for example, an epoxy resin or any other suitable type of molding materials. In some embodiments, the molding compound 160 is formed by providing and then curing a molding material over the wafer 100 to form the molding compound 160 on the redistribution layer 130, and the molding material includes epoxy resins, which is a semi-solid at high temperature. In some embodiments, the molding compound 160 has low filler contents and has low viscosity. In some embodiments, the molding compound 160 partially encapsulates the IPD 140 and the plurality of solder balls 152. In some embodiments, the molding compound 160 is formed to cover the solder balls 152 and the IPD 140 at a height no more than a half of a height of the solder balls 152. That is, in certain embodiments, if a height of the solder balls 152 is H1 (from the top surface of the redistribution layer 130) and a height of the molding compound 160 is H2 (from the top surface of the redistribution layer 130), then the height H2 is equal to or less than (H1)/2. In some embodiments, a height of the IPD 140 is H3 and a height of the molding compound 160 is H2, and the height H3 is equal to or greater than the height H2. In some embodiments, depending on the type of the IPD 140 mounted on the redistribution layer 130, the height H3 of the IPD 140 is larger than the height H2 of the molding compound 160. In certain embodiments, the molding compound 160 is formed to fill the space between the solder balls 152 and between the IPD 140 and the solder balls 152. In some embodiments, the molding compound 160 partially encapsulates the IPD 140 and the plurality of solder balls 152 but at least exposing the top surface 141 of the IPD 140 and top portions 153 (portions above the molding compound 160) of the plurality of solder balls 152.

In certain embodiments, as shown in FIG. 2E, an underfill structure 142 is optionally formed between the IPD 140 and the redistribution layer 130, the molding compound 160 also encapsulates the underfill structure 142. Furthermore, in some embodiments, the redistribution layer 130 is formed after providing the wafer 100, and the molding compound 160 is formed after forming the redistribution layer 130.

Figure 2F:
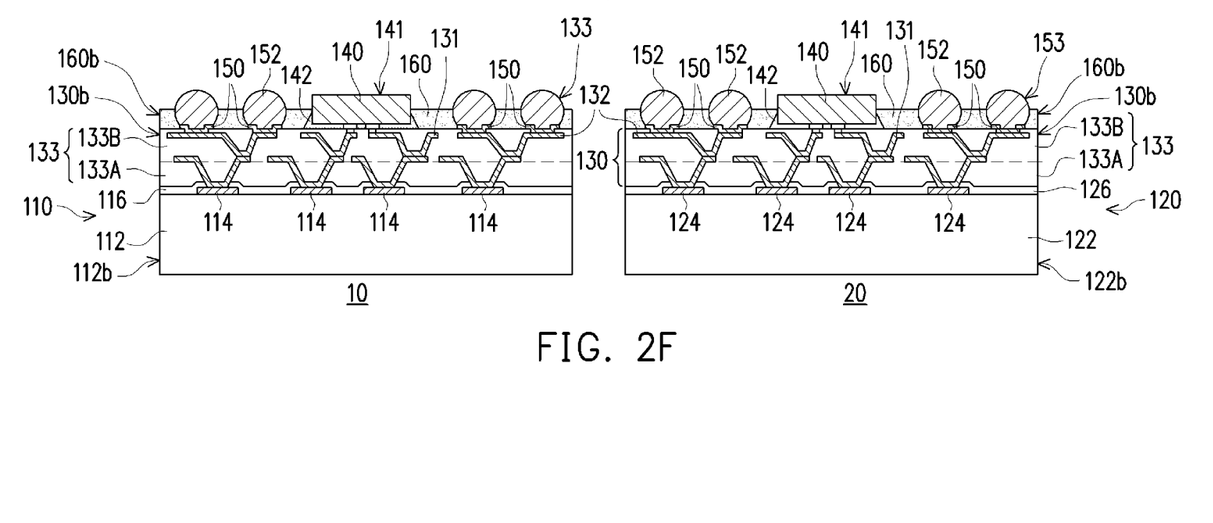

FIG. 2F illustrates a cross-sectional view of the package structure at one of various stages of the fabricating method. Referring to step S600 in FIG. 1 and as shown in FIG. 2F, in some embodiments, the method of fabricating the package structure further comprises performing a wafer dicing process at the dicing line DL after forming the molding compound 160, so as to separate the first die 110 from the second die 120. In some embodiments, the wafer dicing process is performed by cutting through the wafer 100, the redistribution layer 130 and the molding compound 160 so as to separate the structure into individual packages 10 and 20. In some embodiments, the wafer dicing process is performed to cut the packaged wafer 100 into a plurality of packages 10, 20 respectively comprising the first and second dies 110, 120 by using wafer saw technology. Alternatively, in some embodiments, the packages 10, 20 respectively comprising the first and second dies 110, 120 are separated by using laser technology and/or a wafer cutting process. In some embodiments, the manufacturing process described above is part of a wafer level packaging process. In some embodiments, the wafer level packaging process relates to a fan-in wafer level packaging process, and a plurality of fan-in packages or chip scale packages (such as package 10 and package 20) is obtained after the wafer dicing process.

As shown in FIG. 2F, in some embodiment, after cutting the molding compound 160, the redistribution layer 130 and the first/second substrate 112/122 by the wafer dicing process, the sidewalls 130b of the redistribution layer 130 and the sidewalls 160b of the molding compound 160 are substantially aligned vertically, and the sidewalls 160b of the molding compound 160 are substantially aligned with the sidewalls 112b/122b of the first/second substrate 112/122.

Figure 3A:
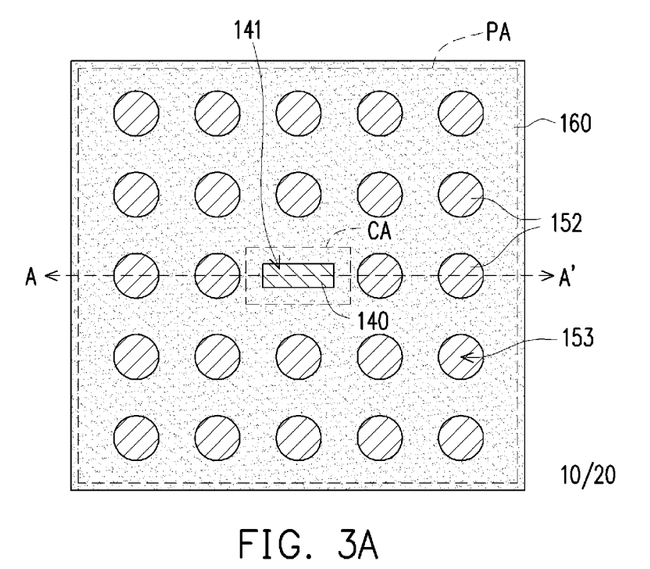
FIGS. 3A-3B are the top views showing the package structure at various stages of the method of fabricating a package structure according to some embodiments of the present disclosure.

FIG. 3A is the top view showing the package structure at various stages of the method of fabricating a package structure according to some embodiments of the present disclosure. Referring to FIG. 3A, it represents one of several embodiments of a top view of a package structure (package 10 or package 20) obtained in the step shown in FIG. 2F, wherein the package structure (10/20) obtained in FIG. 2F is for example, a sectional view taken alone line A-A' of FIG. 3A. In some embodiments as shown in FIG. 3A, the package structure (10/20) is shown to have a central area CA and a peripheral area PA. In certain embodiments, an IPD 140 is disposed in the central area CA of the package structure (10/20), whereas the plurality of solder balls 152 is disposed in the peripheral area PA of the package structure (10/20) around the central area. In certain embodiments, as shown in FIG. 3A, the IPD 140 is surrounded by the plurality of solder balls 152. In some embodiments, the IPD 140 may be placed in the central area CA at the midpoint position or epicenter positions. Furthermore, in some embodiments, from the top view as shown in FIG. 3A, the molding compound 160 is observed between each of the solder balls 152, and between the IPD 140 and the solder balls 152, exposing the top surface 141 of the IPD 140 and top portions 153 of the solder balls 152 but covering the underlying redistribution layer 130 and the substrate (112/122) of the die (110/120). That is, in such embodiments, an orthogonal projection of the molding compound 160 completely covers an orthogonal projection of the redistribution layer 130 and an orthogonal projection of the substrate (112/122) of the die (110/120). Furthermore, in some embodiments, the orthogonal projection of the molding compound 160 and that of the redistribution layer 130 are substantially coincided with the orthogonal projection of the substrate (112/122) of the die (110/120).

Figure 3B:
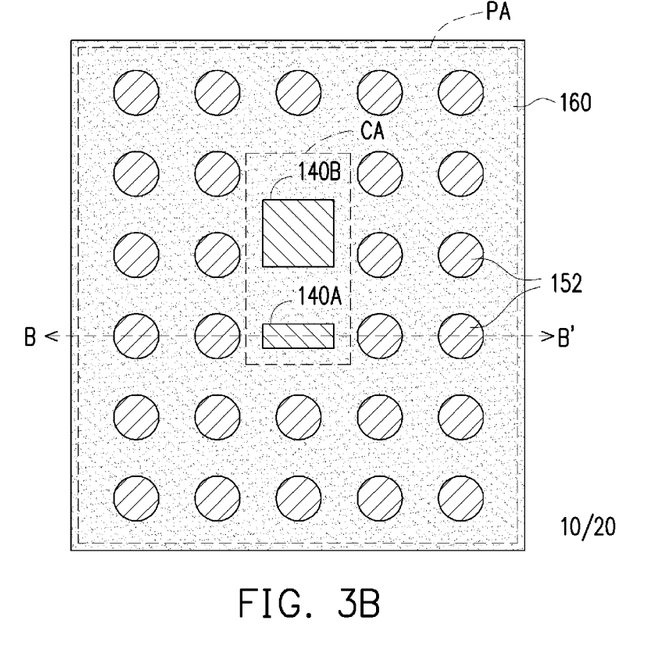

FIG. 3B is the top view showing the package structure at various stages of the method of fabricating a package structure according to some embodiments of the present disclosure. Referring to FIG. 3B, it represents one of several embodiments of a top view of a package structure (package 10 or package 20) obtained in the step shown in FIG. 2F, wherein the package structure (10/20) obtained in FIG. 2F is for example, a sectional view taken alone line B-B' of FIG. 3B. In some embodiments as shown in FIG. 3B, the package structure (10/20) is shown to have a central area CA and a peripheral area PA around the central area CA. In some embodiments, two or more IPDs may be provided. In certain embodiments, a first IPD 140A and a second IPD 140B are disposed in the central area CA of the package structure (10/20), whereas the plurality of solder balls 152 is disposed in the peripheral area PA of the package structure (10/20)

and arranged around and surrounding the first and second IPDs 140A, 140B. In certain embodiments, as shown in FIG. 3B, the first and second IPDs 140A, 140B are arranged beside each other and located within the central area CA surrounding by the plurality of solder balls 152. Similar to the embodiment shown in FIG. 3A, from the top view as shown in FIG. 3B, the top surfaces of the first and second IPDs 140A, 140B and the top portions of the solder balls 152 are exposed from the molding compound 160. In some embodiments, the first and second IPDs 140A, 140B are different types of passive components. In one embodiment, the first IPD 140A includes a capacitor and the second IPD 140B includes an inductor, a resistor or even an antenna, for example. In some embodiments, the first and second IPDs 140A, 140B are the same type of passive components. In one embodiment, the first IPD 140A includes a capacitor and the second IPD 140B includes another capacitor of the same or different capacitance, for example.

From the above embodiments, it is noted that the number or type of the IPD(s) 140 disposed on the redistribution layer is not particularly limited, and can be adjusted based on design requirements. Furthermore, in some embodiments, the number of solder balls 150 is not particularly limited, and can be adjusted based on the size or layout design of the package structure (10/20).

In accordance with some embodiments in the present disclosure, compared with the area-consuming arrangement of the passive components arranged around the package die, the passive devices (IPDs) or passive components that are laid directly on the redistribution layer and integrated into the fan-in package structures just occupy little footprint area, so as to provide small footprint and compact package structures. As the IPDs or passive components are protected by the molding compound covering the redistribution layer, better connection reliability of the package structures is achieved. That is, the passive devices are packaged during the wafer level packaging process and are integrated on top (or within) of the die (wafer) to form compact package structures with better electrical properties and reliability. In such package structure designs disclosed in the present disclosure, the integrated passive device (IPD) is disposed on the redistribution layer and electrically connected to the underlying die through the first connection structures of the redistribution layer, thus providing better electrical performance with short electrical paths. In some embodiment, by integrating the passive device(s) on the die and within the package structure, the loop inductance is reduced as the IPD is arranged closer to the device within the underlying substrate. Furthermore, the passive devices (IPD) are arranged on the redistribution layer with the solder balls surrounding the passive devices, and is protected or encapsulated by the molding compound, leading to improved connection reliability.

In some embodiments of the present disclosure, a package structure is provided comprising a die, a redistribution layer, at least one integrated passive device (IPD), a plurality of solder balls and a molding compound. The die comprises a substrate and a plurality of conductive pads formed on the substrate. The redistribution layer is disposed on the die, wherein the redistribution layer comprises first connection structures and second connection structures, and the first connection structures and the second connection structures are electrically connected to the plurality of conductive pads. The at least one IPD is disposed on the redistribution layer and electrically connected to the die, wherein the at least one IPD is disposed on and connected to the first connection structures of the redistribution layer. The plurality of solder balls is disposed on the redistribution layer and electrically connected to the die, wherein the plurality of solder balls is disposed on and connected to the second connection structures of the redistribution layer. The molding compound is disposed on the redistribution layer, covering the redistribution layer and partially encapsulating the at least one IPD and the plurality of solder balls, wherein top portions of the plurality of solder balls and a top surface of the at least one IPD are exposed from the molding compound.

In some embodiments of the present disclosure, a package structure is provided comprising a die, a redistribution layer, a plurality of integrated passive devices (IPDs), a plurality of ball pads, a plurality of solder balls and a molding compound. The die comprises a substrate and a plurality of conductive pads. The redistribution layer is disposed on the die, wherein the redistribution layer comprises a dielectric layer, first connection structures and second connection structures, and the dielectric layer separates the first connection structures from the second connection structures. The plurality of IPDs is disposed on the redistribution layer, wherein the plurality of IPDs is connected to the die through the first connection structures of the redistribution layer. The plurality of ball pads is disposed on the redistribution layer and electrically connected to the redistribution layer. The plurality of solder balls is disposed on the plurality of ball pads and surrounding the plurality of IPDs, wherein the plurality of solder balls is electrically connected to the plurality of conductive pads of the die through the second connection structures of the redistribution layer. The molding compound is disposed on the redistribution layer, partially encapsulating the plurality of IPDs and the plurality of solder balls, and partially exposing the plurality of IPDs and the plurality of solder balls, wherein sidewalls of the redistribution layer and sidewalls of the molding compound are substantially aligned vertically.

In some embodiments of the present disclosure, a method of fabricating a package structure is described. A wafer is provided, the wafer comprises a first die and a second die, wherein the first die comprises a first substrate and a plurality of first conductive pads, and the second die comprises a second substrate and a plurality of second conductive pads. A redistribution layer is formed on the wafer, wherein the redistribution layer comprises first connection structures and second connection structures that are formed within a dielectric layer, and the first connection structures and the second connection structures are electrically connected to the plurality of first conductive pads and the plurality of second conductive pads. A plurality of integrated passive devices (IPDs) is disposed on the redistribution layer and the plurality of IPDs is connected to the first connection structures, wherein the plurality of IPDs is electrically connected to the first die and the second die through the first connection structures of the redistribution layer. A plurality of solder balls is disposed on the redistribution layer, wherein each of the plurality of solder balls is electrically connected to the first die or the second die through the second connection structures of the redistribution layer. A molding compound is formed on the redistribution layer and partially encapsulating the plurality of IPDs and the plurality of solder balls. A wafer dicing process is performed so as to separate the first die from the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fan-in package structure, comprising:
 a semiconductor substrate having a plurality of conductive pads;
 a passivation layer disposed on the semiconductor substrate, and having openings that partially expose the plurality of conductive pad;
 a first layer of first connection structures and a first layer of second connection structures disposed on the semiconductor substrate and within the openings of the passivation layer, and physically connected with the plurality of conductive pads;
 a first dielectric layer surrounding the first layer of first connection structures and the first layer of second connection structures, wherein the first layer of first connection structures is physically and electrically separated from the first layer of second connection structures by the first dielectric layer, and wherein a material of the first dielectric layer is different from a material of the passivation layer;
 a second layer of first connection structures disposed on, and electrically and physically connected to the first layer of first connection structures, and a second layer of second connection structures disposed on, and electrically and physically connected to the first layer of second connection structures;
 a second dielectric layer surrounding and partially covering tops of the second layer of first connection structures and tops of the second layer of second connection structures, wherein the second layer of first connection structures is physically and electrically separated from the second layer of second connection structures by the second dielectric layer, and wherein a material of the second dielectric layer is different from a material of the passivation layer;
 at least one integrated passive device disposed on the second dielectric layer, wherein the first layer of first connection structures and the second layer of first connection structures are physically connected to the at least one integrated passive device and provide a direct electrical connection route connecting the at least one integrated passive device to portions of the plurality of conductive pads;
 an underfill structure filling a gap between the at least one integrated passive device and the second dielectric layer, wherein the underfill structure partially covers sidewalls of the at least one integrated passive device;
 solder balls surrounding the at least one integrated passive device and disposed on the second dielectric layer, wherein the first layer of second connection structures and the second layer of second connection structures are electrically connected to the solder balls, wherein the first layer of first connection structures and the second layer of first connection structures are electrically separated from the solder balls;
 electrical connectors disposed between and electrically connecting the at least one integrated passive device and the second layer of first connection structures, wherein the electrical connectors are partially covered by the underfill structure; and
 a molding layer, disposed on the second dielectric layer, wherein the molding layer fully encapsulates the underfill structure and partially encapsulates the at least one integrated passive device and the solder balls, and wherein sidewalls of the molding layer, sidewalls of the passivation layer, sidewalls of the first dielectric layer, sidewalls of the second dielectric layer and sidewalls of the semiconductor substrate are substantially aligned vertically, and wherein a bottom surface of the molding layer is aligned with a bottom surface of the underfill structure, and wherein a flat topmost surface of the molding layer intersects a mid-portion of sidewalls of the integrated passive device and a mid-portion of sidewalls of the solder balls surrounding the integrated passive device.

2. The structure according to claim 1, further comprising:
 a plurality of connecting pads disposed on the second dielectric layer, wherein the plurality of connecting pads are electrically and physically connected to the second layer of second connection structures, and wherein the solder balls are disposed on and physically connected to portions of the plurality of connecting pads.

3. The structure according to claim 2, wherein a height of the molding layer is less than or equivalent to a half of a height of the solder balls.

4. The structure according to claim 2, wherein the at least one integrated passive device is disposed in a central area of the fan-in package structure, and wherein the solder balls are disposed in a peripheral area of the fan-in package structure and surround the at least one integrated passive device.

5. The structure according to claim 1, wherein the sidewalls of the semiconductor substrate and the sidewalls of the first dielectric layer and the second dielectric layer are exposed by the molding layer.

6. The structure according to claim 1, further comprising at least two types of integrated passive devices selected from a capacitor, an inductor, a resistor and an antenna.

7. A chip-scale semiconductor package, comprising:
 a semiconductor die structure, the semiconductor die structure comprises:
  a semiconductor substrate comprising conductive pads;
  a redistribution layer consisting of dielectric layers and redistribution lines embedded in the dielectric layers, wherein the redistribution layer is disposed on the semiconductor substrate and electrically connected to the conductive pads, wherein sidewalls of the redistribution layer and sidewalls of the semiconductor substrate are substantially aligned vertically, and the sidewalls of the redistribution layer and the sidewalls of the semiconductor substrate are exposed from the semiconductor die structure;
 a capacitor disposed on the redistribution layer and electrically connected to the conductive pads, wherein the redistribution lines of the redistribution layer provides a direct electrical connection route connecting bumps of the capacitor to at least one of the conductive pads that is partially overlapped with the capacitor;
 an inductor disposed aside the capacitor on the redistribution layer and electrically connected to the conductive pads, wherein the redistribution lines of the redistribution layer electrically connects the inductor to another one of the conductive pads;
 a plurality of solder balls disposed on the redistribution layer and surrounding the capacitor and the inductor, wherein a height of the capacitor is smaller than a height of the plurality of solder balls; and
an underfill structure filling a gap between the capacitor and the redistribution layer, wherein the underfill structure partially covers sidewalls of the capacitor;
a molding layer disposed on the redistribution layer fully encapsulating the underfill structure and partially encapsulating the capacitor, the inductor and the plurality of solder balls, wherein the molding layer at least expose a top surface of the capacitor, a top surface of the inductor and top portions of the plurality of solder balls, and a flat topmost surface of the molding layer intersects mid-portions of sidewalls of the capacitor and the inductor, and intersects a mid-portion of sidewalls of the solder balls surrounding the capacitor and the inductor.

8. The semiconductor package according to claim 7, wherein the sidewalls of the redistribution layer and the sidewalls of the semiconductor substrate are vertically aligned with sidewalls of the molding layer.

9. The semiconductor package according to claim 7, wherein a height of the molding layer is less than or equivalent to a half of a height of the solder balls.

10. The semiconductor package according to claim 7, wherein the capacitor, the inductor and the plurality of solder balls are located on a same surface of the redistribution layer.

11. The semiconductor package according to claim 7, wherein:
the dielectric layers consist of a first dielectric layer and a second dielectric layer;
the redistribution lines consist of first redistribution lines and second redistribution lines, wherein the first redistribution lines are embedded within the first dielectric layer and the second dielectric layer, and physically connected to the bumps of the capacitor and the conductive pads; and
the second redistribution lines are embedded within the first dielectric layer and the second dielectric layer, physically connected to a plurality of under-ball metallurgy (UBM) patterns located below the plurality of solder balls, and physically connected to the conductive pads, wherein the first redistribution lines and the second redistribution lines are physically separate from one another.

12. The semiconductor package according to claim 7, wherein sidewalls of the capacitor are partially exposed from the molding layer.

13. The semiconductor package according to claim 7, further comprising a passivation layer disposed on the semiconductor substrate and partially covering the conductive pads, wherein sidewalls of the passivation layer are vertically aligned with the sidewalls of the redistribution layer.

14. A method of fabricating a fan-in package structure, comprising:
providing a semiconductor wafer having a semiconductor substrate and a plurality of conductive pads;
forming a passivation layer on the semiconductor substrate, wherein the passivation layer has openings that partially expose the plurality of conductive pads;
forming a first dielectric layer on the passivation layer, wherein a material of the first dielectric layer is different from a material of the passivation layer;
forming a first layer of first connection structures and a first layer of second connection structures in the first dielectric layer and over the semiconductor substrate, wherein the first layer of first connection structures and the first layer of second connection structures fill in the openings of the passivation layer, and are physically connected with the plurality of conductive pads, and wherein the first layer of first connection structures is physically and electrically separated from the first layer of second connection structures by the first dielectric layer;
forming a second dielectric layer on the first dielectric layer, wherein a material of the second dielectric layer is different from a material of the passivation layer;
forming a second layer of first connection structures and a second layer of second connection structures in the second dielectric layer, wherein the second layer of first connection structures is disposed on, and electrically and physically connected to the first layer of first connection structures, and the second layer of second connection structures is disposed on, and electrically and physically connected to the first layer of second connection structure, wherein the second dielectric layer is surrounding and partially covering tops of the second layer of first connection structures and tops of the second layer of second connection structures, and wherein the second layer of first connection structures is physically and electrically separated from the second layer of second connection structures by the second dielectric layer;
disposing at least one integrated passive device on the second dielectric layer and physically and electrically connecting the at least one integrated passive device to the second layer of first connection structures, wherein the first layer of first connection structures and the second layer of first connection structures provide a direct electrical connection route connecting the at least one integrated passive device to portions of the plurality of conductive pads;
forming an underfill structure filling a gap between the at least one integrated passive device and the second dielectric layer, wherein the underfill structure partially covers sidewalls of the at least one integrated passive device;
disposing a plurality of solder balls on the second dielectric layer to surround the at least one integrated passive device, wherein the first layer of second connection structures and the second layer of second connection structures are electrically connected to the plurality of solder balls, wherein the first layer of first connection structures and the second layer of first connection structures are electrically separated from the plurality of solder balls;
forming a molding layer on the second dielectric layer fully encapsulating the underfill structure, while partially encapsulating the at least one integrated passive device and the plurality of solder balls, wherein a bottom surface of the molding layer is aligned with a bottom surface of the underfill structure, and wherein a flat topmost surface of the molding layer intersects a mid-portion of sidewalls of the at least one integrated passive device and a mid-portion of sidewalls of the plurality of solder balls surrounding the at least one integrated passive device; and
performing a wafer dicing process along a vertical dicing line by cutting through the molding layer and through the semiconductor substrate to form a plurality of packages.

15. The method according to claim 14, wherein the wafer dicing process is performed to cut through the molding layer, the semiconductor substrate, the passivation layer, the first dielectric layer and the second dielectric layer to allow sidewalls of the molding layer, sidewalls of the semiconductor substrate, sidewalls of the passivation layer, sidewalls of the first dielectric layer and sidewalls of the second dielectric layer to be substantially aligned vertically.

16. The method according to claim 14, wherein the molding layer is formed to cover the plurality of solder balls at a height no more than half of a height of the plurality of solder balls.

17. The method according to claim 14, wherein the molding layer is formed after forming the second dielectric layer, disposing the at least one integrated passive device and disposing the plurality of solder balls.

* * * * *